US012640735B2

(12) United States Patent
Lee et al.

(10) Patent No.: US 12,640,735 B2
(45) Date of Patent: May 26, 2026

(54) SEMICONDUCTOR DEVICE AND OPERATING METHOD THEREOF

(71) Applicant: TAIWAN SEMICONDUCTOR MANUFACTURING COMPANY, LTD., Hsinchu (TW)

(72) Inventors: Cheng Hung Lee, Hsinchu County (TW); Chien-Yu Huang, Taoyuan City (TW); Yen-Chi Chou, Tainan City (TW); Shao Hsuan Hsu, Taoyuan City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 79 days.

(21) Appl. No.: 18/663,791

(22) Filed: May 14, 2024

(65) Prior Publication Data

US 2025/0357926 A1 Nov. 20, 2025

(51) Int. Cl.
*H03K 19/00* (2006.01)

(52) U.S. Cl.
CPC ..... *H03K 19/0016* (2013.01); *H03K 19/0013* (2013.01)

(58) Field of Classification Search
CPC ........................ H03K 19/0016; H03K 19/0013
See application file for complete search history.

(56) References Cited

U.S. PATENT DOCUMENTS

| | | | | |
|---|---|---|---|---|
| 4,940,908 A * | 7/1990 | Tran | ................. | H03K 19/01707 |
| | | | | 326/98 |
| 5,245,230 A * | 9/1993 | Ohri | .................... | H03K 17/102 |
| | | | | 327/427 |
| 11,677,399 B1 * | 6/2023 | Wu | .................... | H03K 19/0016 |
| | | | | 326/38 |

* cited by examiner

*Primary Examiner* — Daniel D Chang

(74) *Attorney, Agent, or Firm* — Birch, Stewart, Kolasch & Birch, LLP

(57) ABSTRACT

A semiconductor device includes a first transistor, a second transistor and a multiplexer. The first transistor is controlled by a first control signal. The second transistor is coupled in series with the first transistor, and is controlled by a first voltage signal. The multiplexer is configured to generate the first voltage signal according to the first control signal.

20 Claims, 8 Drawing Sheets

400

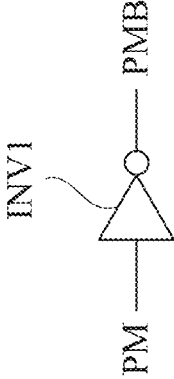
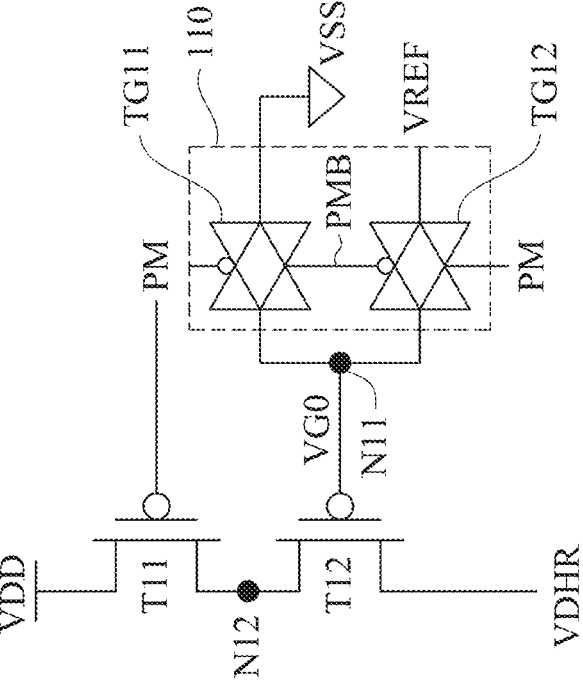
FIG. 1

200

400

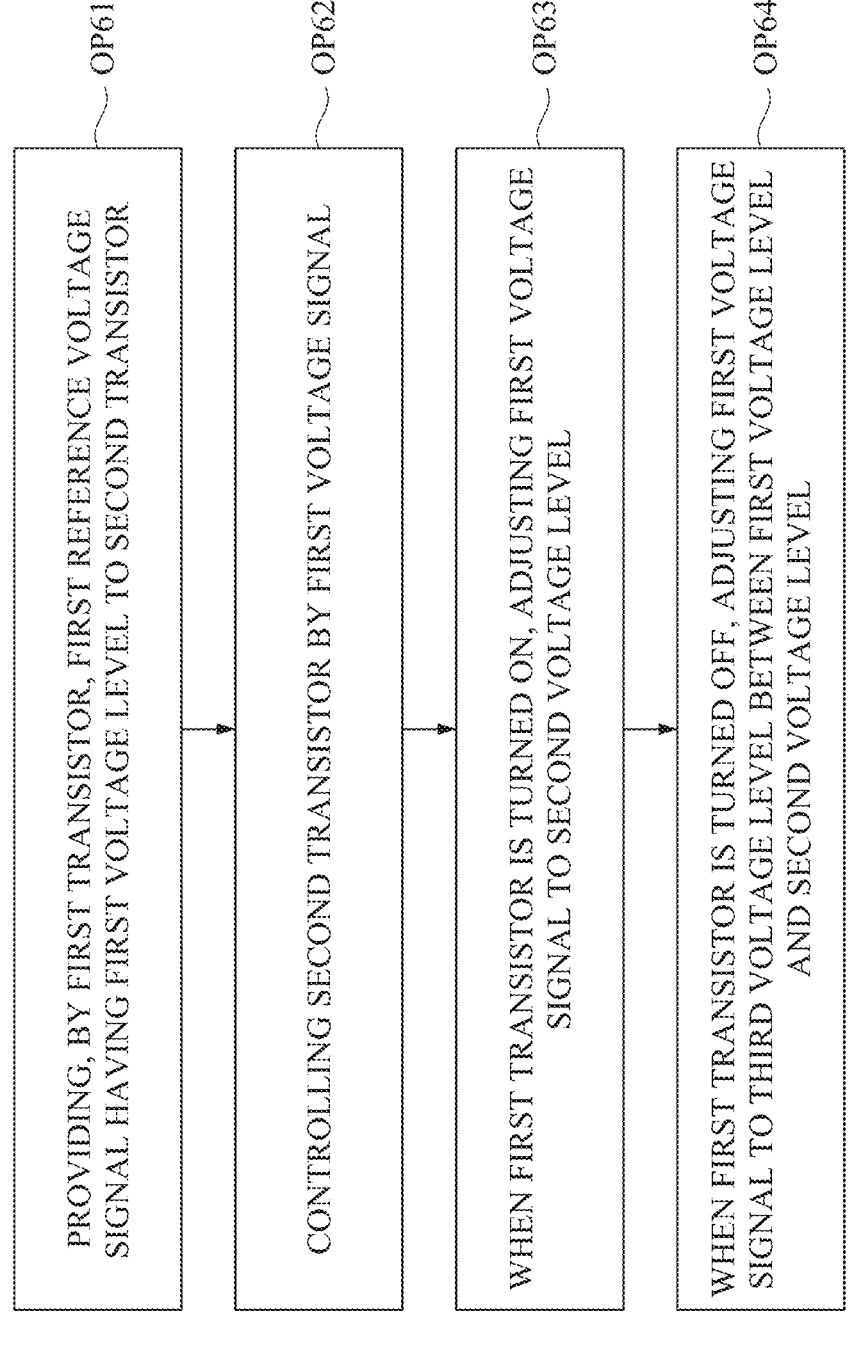

OP61 — PROVIDING, BY FIRST TRANSISTOR, FIRST REFERENCE VOLTAGE SIGNAL HAVING FIRST VOLTAGE LEVEL TO SECOND TRANSISTOR

OP62 — CONTROLLING SECOND TRANSISTOR BY FIRST VOLTAGE SIGNAL

OP63 — WHEN FIRST TRANSISTOR IS TURNED ON, ADJUSTING FIRST VOLTAGE SIGNAL TO SECOND VOLTAGE LEVEL

OP64 — WHEN FIRST TRANSISTOR IS TURNED OFF, ADJUSTING FIRST VOLTAGE SIGNAL TO THIRD VOLTAGE LEVEL BETWEEN FIRST VOLTAGE LEVEL AND SECOND VOLTAGE LEVEL

SEMICONDUCTOR DEVICE AND OPERATING METHOD THEREOF

BACKGROUND

For some semiconductor devices, polysilicon on oxide diffusion (OD) edge (MPODE) layout pattern is used to fit continuous OD (CNOD) structure for smaller area. Furthermore, MPODE is used to eliminate the P-type metal-oxide-semiconductor (PMOS) layout dependent effect (LDE).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a schematic diagram of a semiconductor device in accordance with some embodiments of the present disclosure.

FIG. 6 is a flowchart diagram of a method corresponding to the semiconductor devices shown in FIG. 1 to FIG. 5, in accordance with some embodiments of the present disclosure.

DETAILED DESCRIPTION

Figure 2:
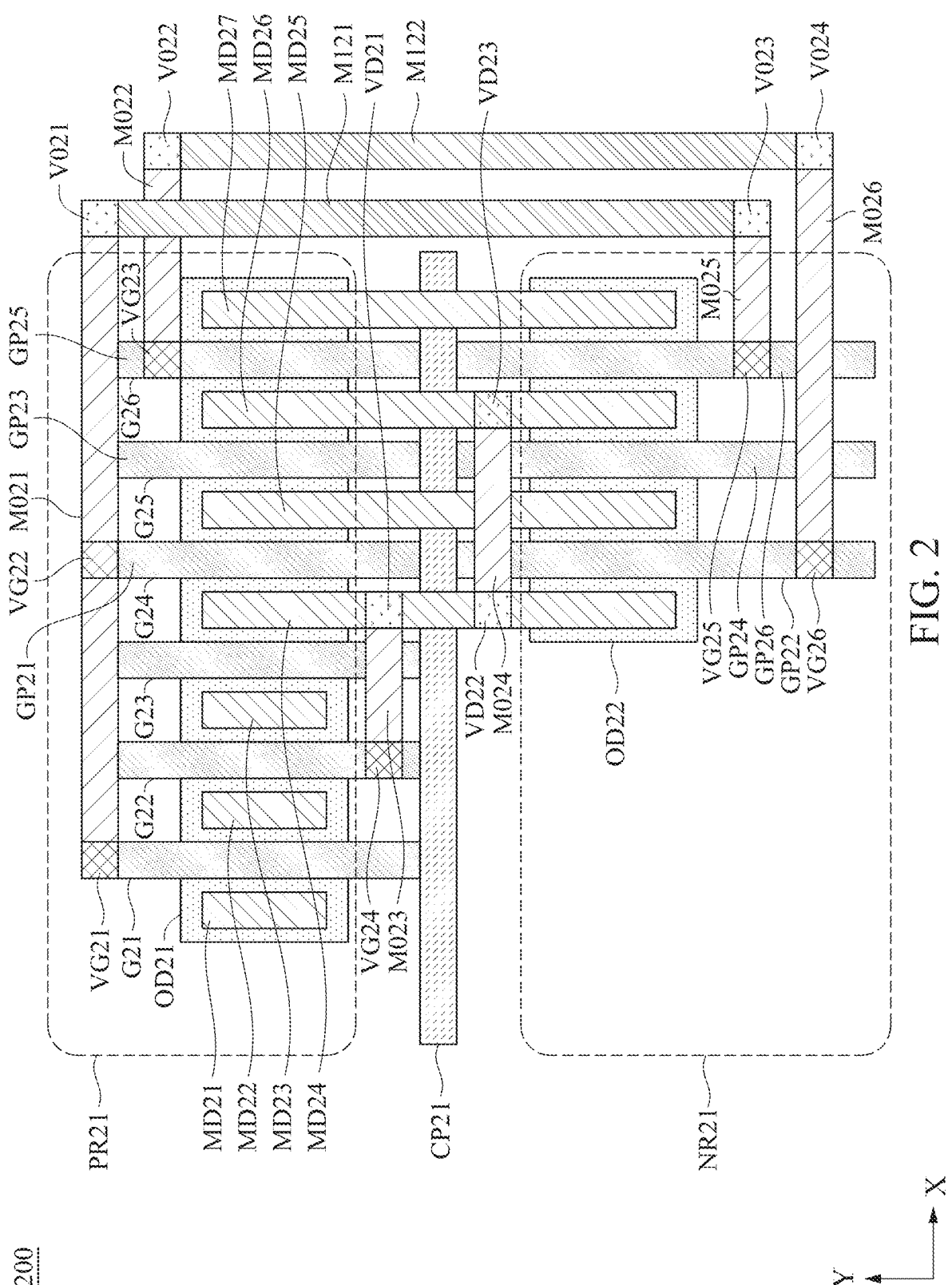
FIG. 2 is a schematic layout diagram of a semiconductor device corresponding to the semiconductor device shown in FIG. 1, in accordance with some embodiments of the present disclosure.

The following disclosure provides many different embodiments, or examples, for implementing different features of the provided subject matter. Specific examples of components, materials, values, steps, arrangements or the like are described below to simplify the present disclosure. These are, of course, merely examples and are not intended to be limiting. Other components, materials, values, steps, arrangements or the like are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. As used herein, "around," "about," "approximately," or "substantially" may generally mean within 20 percent, or within 10 percent, or within 5 percent of a given value or range. Numerical quantities given herein are approximate, meaning that the term "around," "about," "approximately," or "substantially" can be inferred if not expressly stated. One skilled in the art will realize, however, that the values or ranges recited throughout the description are merely examples, and may be reduced or varied with the down-scaling of the integrated circuits.

The terms applied throughout the following descriptions and claims generally have their ordinary meanings clearly established in the art or in the specific context where each term is used. Those of ordinary skill in the art will appreciate that a component or process may be referred to by different names. Numerous different embodiments detailed in this specification are illustrative only, and in no way limits the scope and spirit of the disclosure or of any exemplified term.

It is worth noting that the terms such as "first" and "second" used herein to describe various elements or processes aim to distinguish one element or process from another. However, the elements, processes and the sequences thereof should not be limited by these terms. For example, a first element could be termed as a second element, and a second element could be similarly termed as a first element without departing from the scope of the present disclosure.

In the following discussion and in the claims, the terms "comprising," "including," "containing," "having," "involving," and the like are to be understood to be open-ended, that is, to be construed as including but not limited to. As used herein, instead of being mutually exclusive, the term "and/or" includes any of the associated listed items and all combinations of one or more of the associated listed items.

FIG. 1 is a schematic diagram of a semiconductor device 100 in accordance with some embodiments of the present disclosure. The semiconductor device 100 is configured to generate a voltage signal VDHR according to a reference voltage signal VDD. In some embodiments, the semiconductor device 100 is referred to as a power gating device or a stack header. The reference voltage signal VDD and the voltage signal VDHR correspond to true power and virtual power, respectively.

As illustratively shown in FIG. 1, the semiconductor device 100 includes a multiplexer 110 and transistors T11, T12. A terminal of the transistor T11 is configured to receive the reference voltage signal VDD, another terminal of the transistor T11 is coupled to the transistor T12 at a node N12, and a control terminal of the transistor T11 is configured to receive a control signal PM. A terminal of the transistor T12 is configured to output the voltage signal VDHR, another terminal of the transistor T12 is coupled to the node N12, and a control terminal of the transistor T12 is configured to receive a control signal VG0 at a node N11. The multiplexer 110 is configured to generate the control signal VG0 according to the control signal PM and reference voltage signals VSS and VREF.

In some embodiments, the reference voltage signal VSS has a ground voltage level and has a logic value 0. The reference voltage signal VDD has a power voltage level higher than the ground voltage level and has a logic value 1. In some embodiments, a voltage level of the reference voltage signal VDD is higher than a voltage level of the reference voltage signal VSS. A voltage level of the reference voltage signal VREF is between the voltage levels of the reference voltage signals VDD and VSS. For example, the voltage level of the reference voltage signal VREF is within a range of 0.3 times to 0.7 times of the power voltage level.

In some embodiments, the transistors T11 and T12 are implemented by P-type metal-oxide-semiconductor (PMOS) transistors. In such embodiments, the transistors T11 and T12 are turned on in response to the logic value 0 and are turned off in response to the logic value 1.

During operation, when the control signal PM has the logic value 0, the transistor T11 is turned on, and the multiplexer 110 provides the reference voltage signal VSS to the node N11, such that the control signal VG0 has the logic value 0 to turn on the transistor T12. When the control signal PM has the logic value 1, the transistor T11 is turned off, and the multiplexer 110 provides the reference voltage signal VREF to the node N11, such that the control signal VG0 has the voltage level of the reference voltage signal VREF, to reduce gate-induced-drain-leakage (GIDL) through the transistors T11 and T12.

In some approaches, for power control, stack MOS are turned on and off by the same control signal. In such approaches, the leakage is large due to GIDL. As a result, the consumed power is large.

Compared to above approaches, in some embodiments of present disclosure, the transistor T12 is configured to receive the reference voltage signal VREF which is lower than the reference voltage signal VDD, such that GIDL is reduced to mitigate leakage. As a result, the power is saved.

In general, the leakage includes drain-to-source current (ids), base-to-drain current (ibd) and gate-to-drain current (igd), in which the base-to-drain current and the gate-to-drain current correspond to GIDL. In some embodiments, when the voltage level of the reference voltage signal VREF is decrease, the base-to-drain current and the gate-to-drain current are decreased and the drain-to-source current is increased. When the voltage level of the reference voltage signal VREF is increase, the base-to-drain current and the gate-to-drain current are increased and the drain-to-source current is decreased. The voltage level of the reference voltage signal VREF is determined according to the tradeoff between the base-to-drain current, the gate-to-drain current are decreased and the drain-to-source current and the gate-to-drain current.

In some embodiments, a test is performed to determine the voltage level of the reference voltage signal VREF. During the test, the voltage level of the reference voltage signal VREF is adjusted among voltage levels from the voltage level of the reference voltage signal VSS to the voltage level of the reference voltage signal VDD, and leakages corresponding to different voltage levels of the reference voltage signal VREF.

For example, the voltage levels of reference voltage signals VSS and VDD are 0 mV and 750 mV, respectively. At the start of the test, the voltage level of the reference voltage signal VREF is set to 0 mV, and a corresponding leakage of the transistors T11 and T12 is measured. Then, the voltage level of the reference voltage signal VREF is set to 1 mV, and a corresponding leakage is measured, and so on. Accordingly, leakages corresponding to 0 mV to 750 mV are measured, respectively. The voltage level corresponds to a minimum leakage is determined to be the voltage level of the reference voltage signal VREF for operation. For example, in response to the leakage corresponds to 450 mV being the minimum leakage among the leakages corresponding to 0 mV to 750 mV, the voltage level of the reference voltage signal VREF is determined to be 450 mV. Alternatively stated, in such example, the leakage corresponds to 450 mV is smaller than each of the leakages corresponding to 0 mV to 449 mV and 451 mV to 750 mV.

As illustratively shown in FIG. 1, the multiplexer 110 includes transmission gates TG11 and TG12. A terminal of the transmission gate TG11 is coupled to the node N11, another terminal of the transmission gate TG11 is configured to receive the reference voltage signal VSS, a P-type control terminal of the transmission gate TG11 is configured to receive the control signal PM, and an N-type control terminal of the transmission gate TG11 is configured to receive a control signal PMB.

Similarly, a terminal of the transmission gate TG12 is coupled to the node N11, another terminal of the transmission gate TG12 is configured to receive the reference voltage signal VREF, a P-type control terminal of the transmission gate TG12 is configured to receive the control signal PMB, and an N-type control terminal of the transmission gate TG12 is configured to receive the control signal PM.

In some embodiments, the control signals PM and PMB are complementary to each other. Specifically, when the control signal PM has the logic value 1, the control signal PMB has the logic value 0. When the control signal PM has the logic value 0, the control signal PMB has the logic value 1. In some embodiments, the semiconductor device 100 further includes an inverter INV1. The inverter INV1 is configured to invert the control signal PM to generate the control signal PMB.

During operation, in response to the control signal PM having the logic value 0, the transmission gate TG11 is turned on to provide the reference voltage signal VSS to the node N11, and the transmission gate TG12 is turned off. In response to the control signal PM having the logic value 1, the transmission gate TG12 is turned on to provide the reference voltage signal VREF to the node N11, and the transmission gate TG11 is turned off.

Figure 3:
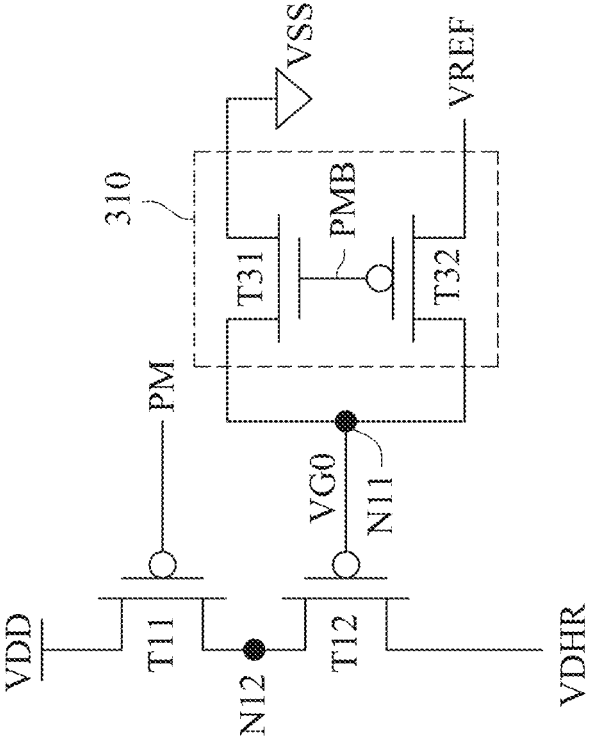
FIG. 3 is a schematic diagram of a semiconductor device corresponding to the semiconductor device shown in FIG. 1, in accordance with some embodiments of the present disclosure.

In some alternative embodiments, the transmission gates TG11 and TG12 are substituted by switches other than transmission gates, such as the transistors T31 and T32 shown in FIG. 3.

FIG. 2 is a schematic layout diagram of a semiconductor device 200 corresponding to the semiconductor device 100 shown in FIG. 1, in accordance with some embodiments of the present disclosure. Referring to FIG. 1 and FIG. 2, the semiconductor device 100 is implemented by the semiconductor device 200 in some embodiments.

As illustratively shown in FIG. 2, the semiconductor device 200 includes a PMOS region PR21, an NMOS region NR21, source/drain structures OD21, OD22, gate structures G21-G26, conductive segments MD21-MD27, M021-M026, M121-M122 and via structures VG21-VG26, VD21-VD23, V021-V023.

In some embodiments, the PMOS region PR21 and the NMOS region NR21 are separated from each other along a Y direction. The source/drain structure OD21 is disposed within the PMOS region PR21. The source/drain structure OD22 is disposed within the NMOS region NR21. In some embodiments, the source/drain structures OD21 and OD22 are implemented by P-type oxide diffusion (OD) material and N-type OD material, respectively.

As illustratively shown in FIG. 2, the gate structures G21-G26 are separated from each other along an X direction. In some embodiments, the X direction and the Y direction are perpendicular with each other. Each of the gate structures G21-G23 crosses over the source/drain structure OD21, and each of the gate structures G24-G26 crosses over the source/drain structures OD21 and OD22. In some embodiments, the gate structures G21-G26 are implemented by poly-silicon.

In some embodiments, each of the gate structures G24-G26 is cut according to a cut region CP21. The gate structure G24 is cut into gate portions GP21 and GP22. The gate structure G25 is cut into gate portions GP23 and GP24. The gate structure G26 is cut into gate portions GP25 and GP26. Each of the gate portions GP21, GP23 and GP25 crosses over the source/drain structure OD21, and each of the gate portions GP22, GP24 and GP26 crosses over the source/drain structure OD22.

In some embodiments, each of the gate structures G23 and G25 is configured to operate as a dummy gate. Alternatively stated, each of the gate structures G23 and G25 does not operate as a control terminal of a transistor. In some embodiments, the dummy gate is a polysilicon on oxide diffusion (OD) edge (PODE) layout pattern. In some embodiments, the gate structures G23 and G25 are referred to as MPODE, and are configured isolate different MOS transistors on continuous OD (CNOD).

As illustratively shown in FIG. 2, along the X direction, the conductive segments MD21-MD27 are separated from each other, and are arranged alternately with the gate structures G21-G26. Each of the conductive segments MD21-MD23 is disposed above the source/drain structure OD21. Each of the conductive segments MD24-MD27 is disposed above the source/drain structures OD21 and OD22. In some embodiments, the conductive segments MD24-MD27 cross over the cut region CP21, and are configured couple the source/drain structures OD21 and OD22 to each other.

In some embodiments, each of the conductive segments M021-M026 elongates along the X direction, and each of the conductive segments M121-M122 elongates along the Y direction. The conductive segment M023 crosses over the gate structure G23. The conductive segment M024 crosses over the conductive segment MD25 and the gate structures G24 and G25. The conductive segment M026 crosses over the gate structures G25 and G26. The conductive segment M121 crosses over the conductive segment M022.

As illustratively shown in FIG. 2, the conductive segment M021 is coupled to the gate structures G21, G24 and the conductive segment M121 through the via structures VG21, VG22 and V021, respectively. The conductive segment M022 is coupled to the gate structure G26 and the conductive segment M122 through the via structures VG23 and V022, respectively. The conductive segment M023 is coupled to the gate structure G22 and the conductive segment MD24 through the via structures VG24 and VD21, respectively. The conductive segment M024 is coupled to the conductive segments MD24 and MD26 through the via structures VD22 and VD23, respectively. The conductive segment M025 is coupled to the gate structure G26 and the conductive segment M121 through the via structures VG25 and V023, respectively. The conductive segment M026 is coupled to the gate structure G24 and the conductive segment M122 through the via structures VG26 and V024, respectively.

Referring to FIG. 1 and FIG. 2, the semiconductor device 100 is implemented by the semiconductor device 200 in the embodiments. In such embodiments, the control terminals of the transistors T11 and T12 correspond to the gate structure G21 and G22, respectively. The conductive segment MD21 corresponds to the terminal of the transistor T11 and configured to receive the reference voltage signal VDD. The conductive segments MD21 and MD24 correspond to the node N12 and N11, respectively. The conductive segment MD23 corresponds to the terminal of the transistor T12 and configured to output the voltage signal VDHR.

Furthermore, the conductive segment MD25 corresponds to the terminal of the transmission gate TG11 and configured to receive the reference voltage signal VSS. The conductive segment MD27 corresponds to the terminal of the transmission gate TG12 and configured to receive the reference voltage signal VREF. The gate portions GP21 and GP22 correspond to the P-type control terminal and N-type control terminal of the transmission gate TG11, respectively. The gate portions GP25 and GP26 correspond to the P-type control terminal and N-type control terminal of the transmission gate TG12, respectively. Alternatively stated, each of the gate portions GP21 and GP26 is configured to receive the control signal PM, and each of the gate portions GP22 and GP25 is configured to receive the control signal PMB.

FIG. 3 is a schematic diagram of a semiconductor device 300 corresponding to the semiconductor device 100 shown in FIG. 1, in accordance with some embodiments of the present disclosure. Referring to FIG. 3 and FIG. 1, the semiconductor device 300 is an alternative embodiment of the semiconductor device 100. FIG. 3 follows a similar labeling convention to that of FIG. 1. For brevity, the discussion will focus more on differences between FIG. 3 and FIG. 1 than on similarities.

Comparing with the semiconductor device 100, the semiconductor device 300 includes a multiplexer 310 instead of the multiplexer 110. As illustratively shown in FIG. 3, the multiplexer 310 includes transistors T31 and T32. A terminal of the transistor T31 is coupled to the node N11, another terminal of the transistor T31 is configured to receive the reference voltage signal VSS, and a control terminal of the transistor T31 is configured to receive the control signal PMB. A terminal of the transistor T32 is coupled to the node N11, another terminal of the transistor T32 is configured to receive the reference voltage signal VREF, and a control terminal of the transistor T32 is configured to receive the control signal PMB.

In some embodiments, the transistors T31 and T32 have different conductive types. For example, the transistor T31 is implemented by an N-type metal-oxide-semiconductor (NMOS) transistor, and the transistor T32 is implemented by a PMOS transistor.

Figure 4:
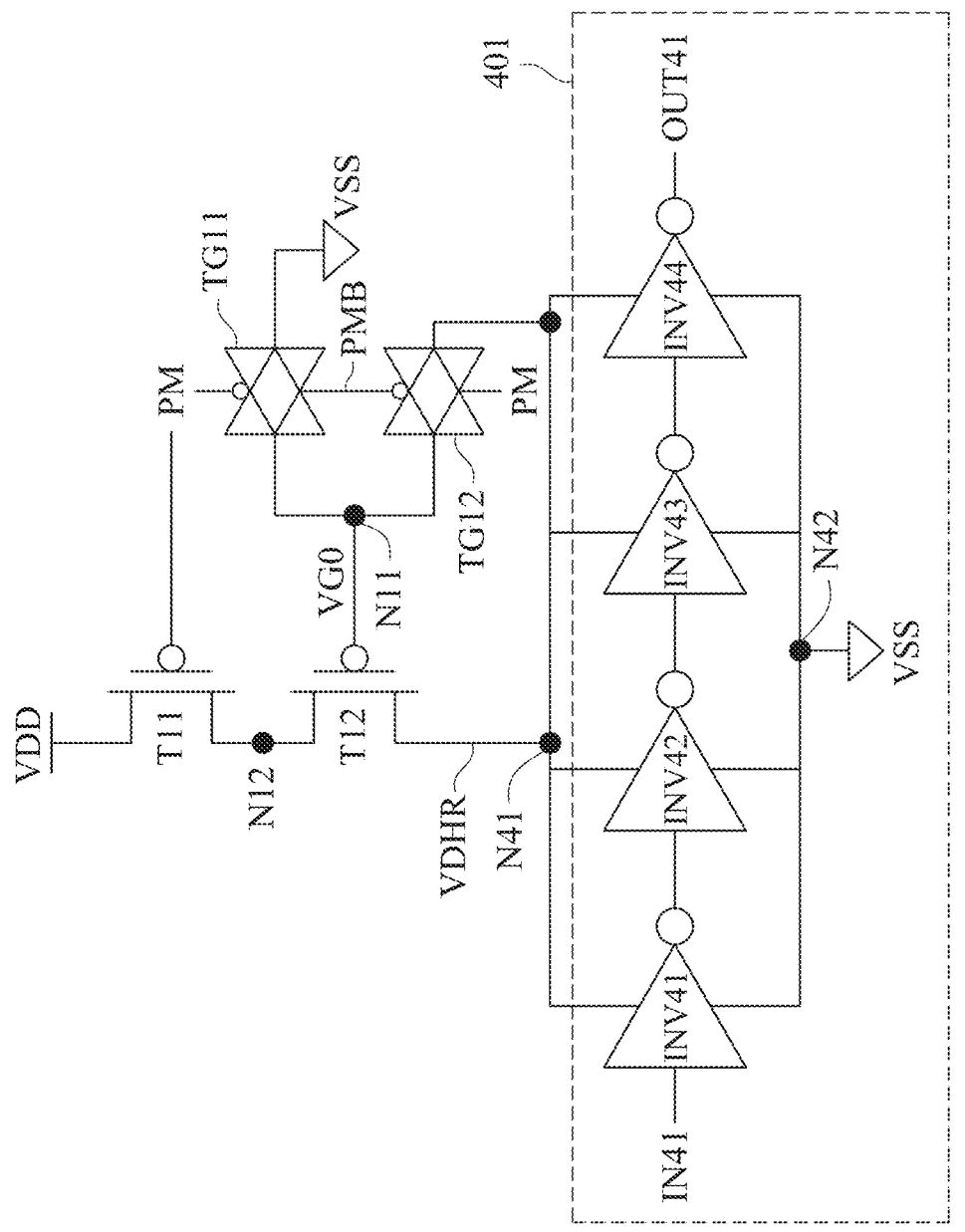
FIG. 4 is a schematic diagram of a semiconductor device corresponding to the semiconductor device shown in FIG. 1, in accordance with some embodiments of the present disclosure.

FIG. 4 is a schematic diagram of a semiconductor device 400 corresponding to the semiconductor device 100 shown in FIG. 1, in accordance with some embodiments of the present disclosure. Referring to FIG. 4 and FIG. 1, the semiconductor device 400 is an alternative embodiment of the semiconductor device 100. FIG. 4 follows a similar labeling convention to that of FIG. 1. For brevity, the discussion will focus more on differences between FIG. 4 and FIG. 1 than on similarities.

Comparing with the semiconductor device 100, the semiconductor device 400 further includes a function circuit 401. The transistor T12 is configured to provide the voltage signal VDHR to the function circuit 401 at a node N41. In some embodiments, the node N41 is referred to as a power terminal of the function circuit 401. In the embodiment shown in FIG. 4, the transmission gate TG12 is configured to receive the voltage signal VDHR at the node N41. Alternatively stated, the reference voltage signal VREF is implemented by the voltage signal VDHR in the embodiment shown in FIG. 4.

In the embodiment shown in FIG. 4, the function circuit 401 includes inverters INV41-INV44. However, the present disclosure is not limited to this. In various embodiments, the function circuit 401 includes various types of logic elements and combination thereof.

As illustratively shown in FIG. 4, an input terminal of the inverter INV41 is configured to receive an input signal IN41. An output terminal of the inverter INV41 is coupled to an input terminal of the inverter INV42. An output terminal of the inverter INV42 is coupled to an input terminal of the inverter INV43. An output terminal of the inverter INV43 is coupled to an input terminal of the inverter INV44. An output terminal of the inverter INV44 is configured to output an output signal OUT41. Each of power terminals of the inverters INV41-INV44 is coupled to the node N41. Each of ground terminals of the inverters INV41-INV44 is configured to receive the reference voltage signal VSS at a node N42.

Figure 5:
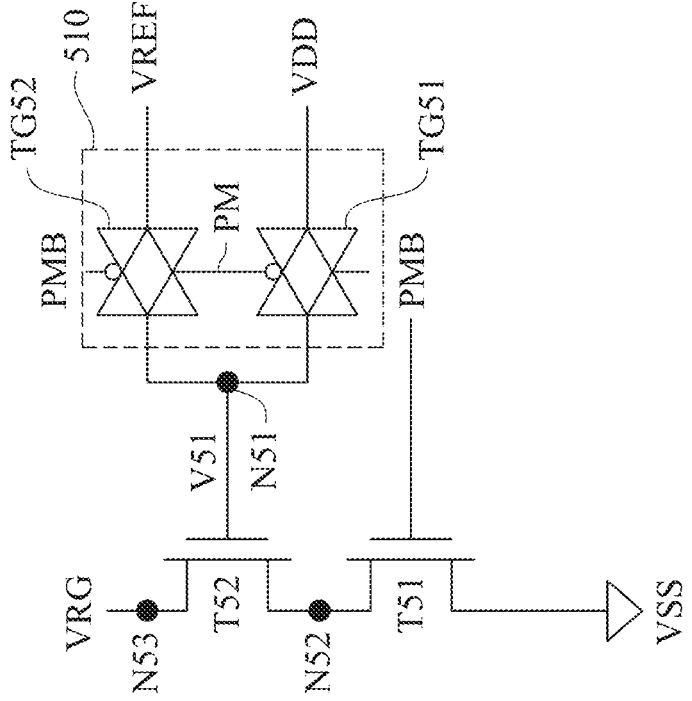
FIG. 5 is a schematic diagram of a semiconductor device corresponding to the semiconductor device shown in FIG. 1, in accordance with some embodiments of the present disclosure.

FIG. 5 is a schematic diagram of a semiconductor device 500 corresponding to the semiconductor device 100 shown in FIG. 1, in accordance with some embodiments of the present disclosure. Referring to FIG. 5 and FIG. 1, the semiconductor device 500 is an alternative embodiment of the semiconductor device 100.

As illustratively shown in FIG. 5, the semiconductor device 500 includes a multiplexer 510 and transistors T51, T52. A terminal of the transistor T51 is configured to receive the reference voltage signal VSS, another terminal of the transistor T51 is coupled to the transistor T52 at a node N52, and a control terminal of the transistor T51 is configured to receive the control signal PMB. A terminal of the transistor T52 is configured to output a voltage signal VRG at a node N53, another terminal of the transistor T52 is coupled to the node N52, and a control terminal of the transistor T52 is configured to receive a control signal V51 at a node N51. The multiplexer 510 is configured to generate the control signal V51 according to the control signal PMB and reference voltage signals VDD and VREF.

In some embodiments, the transistors T51 and T52 are implemented by NMOS transistors. In such embodiments, the transistors T51 and T52 are turned on in response to the logic value 1 and are turned off in response to the logic value 0.

During operation, when the control signal PMB has the logic value 1, the transistor T51 is turned on, and the multiplexer 510 provides the reference voltage signal VDD to the node N51, such that the control signal V51 has the logic value 1 to turn on the transistor T52. When the control signal PMB has the logic value 0, the transistor T51 is turned off, and the multiplexer 510 provides the reference voltage signal VREF to the node N51, such that the control signal V51 has the voltage level of the reference voltage signal VREF, to reduce GIDL leakage through the transistors T51 and T52.

In some embodiments, the multiplexer 510 includes transmission gates TG51 and TG52. A terminal of the transmission gate TG51 is coupled to the node N51, another terminal of the transmission gate TG51 is configured to receive the reference voltage signal VDD, a P-type control terminal of the transmission gate TG51 is configured to receive the control signal PM, and an N-type control terminal of the transmission gate TG51 is configured to receive the control signal PMB.

Similarly, a terminal of the transmission gate TG52 is coupled to the node N11, another terminal of the transmission gate TG52 is configured to receive the reference voltage signal VREF, a P-type control terminal of the transmission gate TG52 is configured to receive the control signal PM, and an N-type control terminal of the transmission gate TG52 is configured to receive the control signal PMB.

During operation, in response to the control signal PM having the logic value 0, the transmission gate TG51 is turned on to provide the reference voltage signal VDD to the node N51, and the transmission gate TG52 is turned off. In response to the control signal PM having the logic value 1, the transmission gate TG52 is turned on to provide the reference voltage signal VREF to the node N51, and the transmission gate TG51 is turned off.

Referring to FIG. 4 and FIG. 5, in some embodiments, the semiconductor device 500 is integrated into the semiconductor device 400. In such embodiments, the ground terminals of the function circuit 401 is coupled to the node N53 instead of the node N42, and the transistor T52 is configured to provide the voltage signal VRG to the function circuit 401 as a virtual ground.

FIG. 6 is a flowchart diagram of a method 600 corresponding to the semiconductor devices 100, 200, 300, 400 and 500 shown in FIG. 1 to FIG. 5, in accordance with some embodiments of the present disclosure. As illustratively shown in FIG. 6, the method 600 includes operations OP61-OP63.

During the operations OP61, a first transistor provides a first reference voltage signal having a first voltage level to a second transistor. For example, the transistor T11 provides the reference voltage signal VDD to the transistor T12.

During the operations OP62, the second transistor is controlled by a first voltage signal. For example, the transistor T12 is controlled by the voltage signal VG0.

During the operations OP63, when the first transistor is turned on, the first voltage signal is adjusted to a second voltage level. For example, when the transistor T11 is turned on, the voltage signal VG0 is adjusted to the voltage level of the reference voltage signal VSS.

During the operations OP64, when the first transistor is turned off, the first voltage signal is adjusted to a third voltage level between the first voltage level and the second voltage level. For example, when the transistor T11 is turned off, the voltage signal VG0 is adjusted to the voltage level of the reference voltage signal VREF or the voltage level of the voltage signal VDHR, in which the voltage levels of the reference voltage signal VREF and the voltage signal VDHR are between the voltage level of the reference voltage signal VDD and the voltage level of the reference voltage signal VSS.

Figure 7:
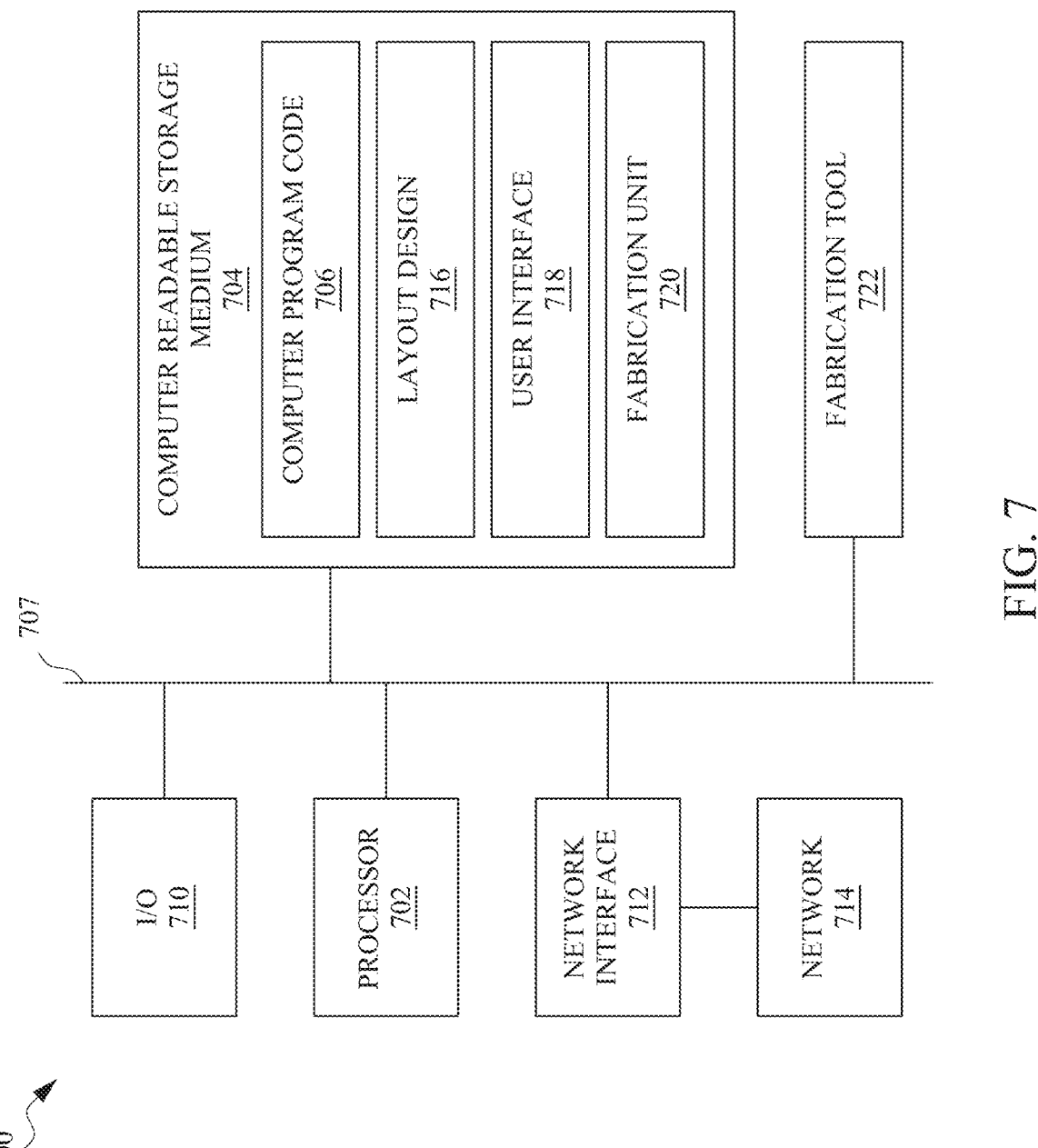
FIG. 7 is a schematic view of a system for designing and manufacturing at least one of the semiconductor devices shown in FIG. 1 to FIG. 5, in accordance with some embodiments of the present disclosure.

FIG. 7 is a schematic view of a system 700 for designing and manufacturing at least one of the semiconductor devices 100, 200, 300, 400 and 500, in accordance with some embodiments of the present disclosure. The system 700 generates or places one or more IC layout designs corresponding to at least one of the semiconductor devices 100, 200, 300, 400 and 500, as described herein. In some embodiments, the system 700 manufactures one or more semiconductor devices based on the one or more IC layout designs, as described herein. The system 700 includes a hardware processor 702 and a non-transitory, computer readable storage medium 704 encoded with, e.g., storing, the computer program code 706, e.g., a set of executable instructions. The computer readable storage medium 704 is configured for interfacing with manufacturing machines for producing the semiconductor device. The processor 702 is electrically coupled to the computer readable storage medium 704 by a bus 707. The processor 702 is also electrically coupled to an I/O interface 710 by the bus 707. A network interface 712 is also electrically connected to the processor 702 by the bus 707. Network interface 712 is connected to a network 714, so that the processor 702 and the computer readable storage medium 704 are capable of connecting to external elements via network 714. The processor 702 is configured to execute the computer program code 706 encoded in the computer readable storage medium 704 in order to cause the system 700 designing and manufacturing at least one of the semiconductor devices 100, 200, 300, 400 and 500.

In some embodiments, the processor 702 is a central processing unit (CPU), a multi-processor, a distributed processing system, an application specific integrated circuit (ASIC), and/or a suitable processing unit.

In some embodiments, the computer readable storage medium 704 is an electronic, magnetic, optical, electromagnetic, infrared, and/or a semiconductor system (or apparatus or device). For example, the computer readable storage medium 704 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 704 includes a compact disk-read only memory (CD-ROM), a compact disk-read/write (CD-R/W), and/or a digital video disc (DVD).

In some embodiments, the storage medium 704 also stores information needed for designing and manufacturing at least one of the semiconductor devices 100, 200, 300, 400 and 500, such as layout design 716, user interface 718, fabrication unit 720, and/or a set of executable instructions to designing and manufacturing at least one of the semiconductor devices 100, 200, 300, 400 and 500.

In some embodiments, the storage medium 704 stores instructions (e.g., the computer program code 706) for interfacing with manufacturing machines. The instructions (e.g., the computer program code 706) enable the processor 702 to generate manufacturing instructions readable by the manufacturing machines to effectively implement the semiconductor devices 100, 200, 300, 400 and 500.

The system 700 includes the I/O interface 710. The I/O interface 710 is coupled to external circuitry. In some embodiments, the I/O interface 710 includes a keyboard, keypad, mouse, trackball, trackpad, and/or cursor direction keys for communicating information and commands to the processor 702.

The system 700 also includes the network interface 712 coupled to the processor 702. The network interface 712 allows the system 700 to communicate with the network 714, to which one or more other computer systems are connected. The network interface 712 includes wireless network interfaces such as BLUETOOTH, WIFI, WIMAX, GPRS, or WCDMA; or wired network interface such as ETHERNET, USB, or IEEE-13154. In some embodiments, the designing and manufacturing of at least one of the semiconductor devices 100, 200, 300, 400 and 500 is implemented in two or more systems 700, and information such as layout design, user interface and fabrication unit are exchanged between different systems 700 by the network 714.

The system 700 is configured to receive information related to a layout design through the I/O interface 710 or network interface 712. The information is transferred to the processor 702 by the bus 707 to determine a layout design for producing an IC. The layout design is then stored in the computer readable medium 704 as the layout design 716. The system 700 is configured to receive information related to a user interface through the I/O interface 710 or network interface 712. The information is stored in the computer readable medium 704 as the user interface 718. The system 700 is configured to receive information related to a fabrication unit through the I/O interface 710 or network interface 712. The information is stored in the computer readable medium 704 as the fabrication unit 720. In some embodiments, the fabrication unit 720 includes fabrication information utilized by the system 700.

In some embodiments, the designing and manufacturing of at least one of the semiconductor devices 100, 200, 300, 400 and 500 is implemented as a standalone software application for execution by a processor. In some embodiments, the designing and manufacturing of at least one of the semiconductor devices 100, 200, 300, 400 and 500 is implemented as a software application that is a part of an additional software application. In some embodiments, the designing and manufacturing of at least one of the semiconductor devices 100, 200, 300, 400 and 500 is implemented as a plug-in to a software application. In some embodiments, the designing and manufacturing of at least one of the semiconductor devices 100, 200, 300, 400 and 500 is implemented as a software application that is a portion of an EDA tool. In some embodiments, the designing and manufacturing of at least one of the semiconductor devices 100, 200, 300, 400 and 500 is implemented as a software application that is used by an EDA tool. In some embodiments, the EDA tool is used to generate a layout design of the integrated circuit device. In some embodiments, the layout design is stored on a non-transitory computer readable medium. In some embodiments, the layout design is generated using a tool such as VIRTUOSO® available from CADENCE DESIGN SYSTEMS, Inc., or another suitable layout generating tool. In some embodiments, the layout design is generated based on a netlist which is created based on the schematic design. In some embodiments, at least one of the semiconductor devices 100, 200, 300, 400 and 500 is implemented by a manufacturing device to manufacture an integrated circuit using a set of masks manufactured based on one or more layout designs generated by the system 700. In some embodiments, the system 700 includes a manufacturing device (e.g., fabrication tool 722) to manufacture an integrated circuit using a set of masks manufactured based on one or more layout designs of the present disclosure.

Figure 8:
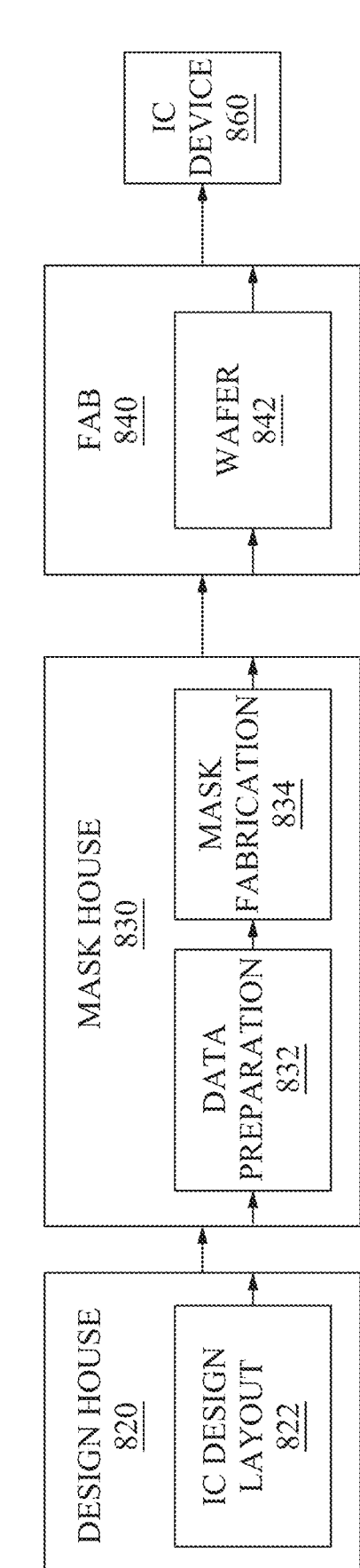
FIG. 8 is a block diagram of an integrated circuit (IC)/semiconductor device manufacturing system, and an IC manufacturing flow associated therewith, in accordance with some embodiments of the present disclosure.

FIG. 8 is a block diagram of an integrated circuit (IC)/semiconductor device manufacturing system 800, and an IC manufacturing flow associated therewith, in accordance with some embodiments of the present disclosure.

In FIG. 8, the IC manufacturing system 800 includes entities, such as a design house 820, a mask house 830, and an IC manufacturer/fabricator ("fab") 840, that interact with one another in the design, development, and manufacturing cycles and/or services related to manufacturing an IC device (semiconductor device) 860 including at least one of the semiconductor devices 100, 200, 300, 400 and 500. The entities in system 800 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 820, mask house 830, and IC fab 840 is owned by a single company. In some embodiments, two or more of design house 820, mask house 830, and IC fab 840 coexist in a common facility and use common resources.

The design house (or design team) 820 generates an IC design layout 822. The IC design layout 822 includes various geometrical patterns designed for the IC device 860. The geometrical patterns correspond to patterns of metal, oxide, or semiconductor layers that make up the various components of the IC device 860 to be fabricated. The various layers combine to form various IC features. For example, a portion of the IC design layout 822 includes various IC features, such as an active region, gate structures, source/drain structures, interconnect structures, and openings for bonding pads, to be formed in a semiconductor substrate (such as a silicon wafer) and various material layers disposed on the semiconductor substrate. The design house 820 implements a proper design procedure to form the IC design layout 822. The design procedure includes one or more of logic design, physical design or place and route. The IC design layout 822 is presented in one or more data files having information of the geometrical patterns. For example, the IC design layout 822 can be expressed in a GDSII file format or DFII file format.

The mask house 830 includes mask data preparation 832 and mask fabrication 834. The mask house 830 uses the IC design layout 822 to manufacture one or more masks to be used for fabricating the various layers of the IC device 860 according to the IC design layout 822. The mask house 830 performs the mask data preparation 832, where the IC design layout 822 is translated into a representative data file ("RDF"). The mask data preparation 832 provides the RDF to the mask fabrication 834. The mask fabrication 834 includes a mask writer. A mask writer converts the RDF to an image on a substrate, such as a mask (reticle) or a semiconductor wafer, or a metal layer which is formed and thereafter selectively etched to form a redistribution layer at a back end of line process of the fab. The design layout is manipulated by the mask data preparation 832 to comply with particular characteristics of the mask writer and/or requirements of the IC fab 840. In FIG. 8, the mask data preparation 832 and mask fabrication 834 are illustrated as separate elements. In some embodiments, the mask data preparation 832 and mask fabrication 834 can be collectively referred to as mask data preparation.

In some embodiments, the mask data preparation 832 includes optical proximity correction (OPC) which uses lithography enhancement techniques to compensate for image errors, such as those that can arise from diffraction, interference, other process effects and the like. OPC adjusts the IC design layout 822. In some embodiments, the mask data preparation 832 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, the mask data preparation 832 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during the mask fabrication 834, which may undo part of the modifications performed by OPC in order to meet mask creation rules.

In some embodiments, the mask data preparation 832 includes lithography process checking (LPC) that simulates processing that will be implemented by the IC fab 840 to fabricate the IC device 860. LPC simulates this processing based on the IC design layout 822 to create a simulated manufactured device, such as the IC device 860. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC can be repeated to further refine the IC design layout 822.

It should be understood that the above description of the mask data preparation 832 has been simplified for the purposes of clarity. In some embodiments, the mask data preparation 832 includes additional features such as a logic operation (LOP) to modify the IC design layout according to manufacturing rules. Additionally, the processes applied to the IC design layout 822 during the mask data preparation 832 may be executed in a variety of different orders.

After the mask data preparation 832 and during mask fabrication 834, a mask or a group of masks are fabricated based on the modified IC design layout. In some embodiments, an electron-beam (e-beam) or a mechanism of multiple e-beams is used to form a pattern on a mask (photomask or reticle) based on the modified IC design layout. The mask can be formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM. The mask(s) generated by the mask fabrication 834 is used in a variety of processes. For example, such a mask(s) is used in an ion implantation process to form various doped regions in the semiconductor wafer, in an etching process to form various etching regions in the semiconductor wafer, and/or in other suitable processes.

The IC fab 840 is an IC fabrication entity that includes one or more manufacturing facilities for the fabrication of a variety of different IC products. In some embodiments, the IC fab 840 is a semiconductor foundry. For example, there may be a first manufacturing facility for the front end fabrication of a plurality of IC products (e.g., source/drain structures, gate structures), while a second manufacturing facility may provide the middle end fabrication for the interconnection of the IC products (e.g., MDs, VDs, VGs) and a third manufacturing facility may provide the back end fabrication for the interconnection and packaging of the IC products (e.g., M0 tracks, M1 tracks, BM0 tracks, BM1 tracks), and a fourth manufacturing facility may provide other services for the foundry entity.

The IC fab 840 uses the mask (or masks) fabricated by the mask house 830 to fabricate the IC device 860. Thus, the IC fab 840 at least indirectly uses the IC design layout 822 to fabricate the IC device 860. In some embodiments, a semiconductor wafer is fabricated by the IC fab 840 using the mask (or masks) to form the IC device 860. The semiconductor wafer 842 includes a silicon substrate or other proper substrate having material layers formed thereon. Semiconductor wafer further includes one or more of various doped regions, dielectric features, multilevel interconnects, and the like (formed at subsequent manufacturing steps).

Also disclosed is a semiconductor device. The semiconductor device includes a first transistor, a second transistor and a multiplexer. The first transistor is controlled by a first control signal. The second transistor is coupled in series with the first transistor, and is controlled by a first voltage signal. The multiplexer is configured to generate the first voltage signal according to the first control signal.

Also disclosed is a method. The method includes: providing, by a first transistor, a first reference voltage signal having a first voltage level to a second transistor; controlling the second transistor by a first voltage signal; when the first transistor is turned on, adjusting the first voltage signal to a second voltage level; and when the first transistor is turned off, adjusting the first voltage signal to a third voltage level between the first voltage level and the second voltage level.

Also disclosed is a semiconductor device. The semiconductor device includes a first transistor, a second transistor, a first switch and a second switch. The second transistor is coupled in series with the first transistor. The first switch is configured to provide a first reference voltage signal to a control terminal of the second transistor when the first transistor is turned on. The second switch is configured to provide a second reference voltage signal to the control terminal of the second transistor when the first transistor is turned off. A voltage level of the first reference voltage signal is smaller than a voltage level of the second reference voltage signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first transistor controlled by a first control signal;
a second transistor coupled in series with the first transistor, and controlled by a first voltage signal; and
a multiplexer configured to generate the first voltage signal according to the first control signal, wherein a control terminal of the first transistor is configured to receive the first control signal.

2. The semiconductor device of claim 1, wherein
when the first transistor is turned on, the first transistor provide a first reference voltage signal having a first voltage level to the second transistor and the first voltage signal has a second voltage level,
when the first transistor is turned off, the first voltage signal has a third voltage level, and
the third voltage level is larger than the second voltage level and is smaller than the first voltage level.

3. The semiconductor device of claim 2, wherein the second transistor is configured to output a second voltage signal having the third voltage level.

4. The semiconductor device of claim 1, wherein the multiplexer comprises:
a first switch configured to transmit a first reference voltage signal to a node according to the first control signal to generate the first voltage signal; and
a second switch configured to transmit a second reference voltage signal to the node according to the first control signal to generate the first voltage signal,
wherein the first reference voltage signal and the second reference voltage signal are different from each other.

5. The semiconductor device of claim 4, wherein two control terminals of the first switch are configured to receive the first control signal and a second control signal, respectively, and
the first control signal and the second control signal are complementary to each other.

6. The semiconductor device of claim 4, wherein the first transistor is configured to receive a third reference voltage signal, and
a voltage level of the second reference voltage signal is between a voltage level of the third reference voltage signal and a voltage level of the first reference voltage signal.

7. The semiconductor device of claim 4, further comprising:
a function circuit, wherein a power terminal of the function circuit is configured to receive the second reference voltage signal from the second transistor.

8. The semiconductor device of claim 7, wherein a ground terminal of the function circuit is configured to receive the first reference voltage signal.

9. A method, comprising:
providing, by a first transistor, a first reference voltage signal having a first voltage level to a second transistor;
controlling the second transistor by a first voltage signal;
when the first transistor is turned on, adjusting the first voltage signal to a second voltage level; and
when the first transistor is turned off, adjusting the first voltage signal to a third voltage level between the first voltage level and the second voltage level.

10. The method of claim 9, further comprising:
controlling each of the first transistor and a multiplexer by a first control signal,
wherein adjusting the first voltage signal to the second voltage level comprises:
providing a second reference voltage signal having the second voltage level to a control terminal of the second transistor by the multiplexer.

11. The method of claim 10, wherein adjusting the first voltage signal to the second voltage level comprises:
providing a third reference voltage signal having the third voltage level to a control terminal of the second transistor by the multiplexer.

12. The method of claim 11, further comprising:

adjusting the third reference voltage signal among a plurality of voltage levels between the second voltage level to the first voltage level to measure a plurality of leakages of the first transistor and the second transistor; and determining the third voltage level according to the plurality of leakages.

13. The method of claim 12, wherein the plurality of leakages correspond to the plurality of voltage levels, respectively, and a minimum leakage of the plurality of leakages corresponds to the third voltage level.

14. The method of claim 10, further comprising:

providing, by the second transistor, a second voltage signal having the third voltage level to a power terminal of a function circuit; and controlling a first switch coupled between the power terminal and the control terminal of the second transistor by the first control signal.

15. The method of claim 14, further comprising:

receiving the second reference voltage signal by each of a ground terminal of the function circuit and a second switch which is coupled to the control terminal of the second transistor; and controlling the second switch by the first control signal.

16. A semiconductor device, comprising:

a first transistor;

a second transistor coupled in series with the first transistor;

a first switch configured to provide a first reference voltage signal to a control terminal of the second transistor when the first transistor is turned on; and a second switch configured to provide a second reference voltage signal to the control terminal of the second transistor when the first transistor is turned off, wherein a voltage level of the first reference voltage signal is smaller than a voltage level of the second reference voltage signal.

17. The semiconductor device of claim 16, further comprising:

a function circuit coupled to the second transistor at a node, wherein the second switch is configured to receive the second reference voltage signal from the node.

18. The semiconductor device of claim 17, wherein a ground terminal of the function circuit is configured to receive the first reference voltage signal.

19. The semiconductor device of claim 16, wherein the first transistor is configured to receive a third reference voltage signal, a voltage level of the third reference voltage signal is larger than the voltage level of the second reference voltage signal.

20. The semiconductor device of claim 16, wherein each of a control terminal of the first transistor, a control terminal of the first switch and a control terminal of the second switch is configured to receive a control signal.

* * * * *